United States Patent
Hoshikawa et al.

(10) Patent No.: US 10,233,020 B2
(45) Date of Patent: Mar. 19, 2019

(54) NOZZLE STORAGE

(71) Applicant: FUJI CORPORATION, Chiryu (JP)

(72) Inventors: Kazumi Hoshikawa, Toyohashi (JP); Kenji Shimosaka, Obu (JP)

(73) Assignee: FUJI CORPORATION, Chiryu (JP)

( * ) Notice: Subject to any disclaimer, the term of this patent is extended or adjusted under 35 U.S.C. 154(b) by 39 days.

(21) Appl. No.: 15/328,942

(22) PCT Filed: Jul. 28, 2014

(86) PCT No.: PCT/JP2014/069819
§ 371 (c)(1),
(2) Date: Jan. 25, 2017

(87) PCT Pub. No.: WO2016/016929
PCT Pub. Date: Feb. 4, 2016

(65) Prior Publication Data
US 2017/0217682 A1  Aug. 3, 2017

(51) Int. Cl.
*B65G 1/06* (2006.01)
*H05K 13/04* (2006.01)

(52) U.S. Cl.
CPC .............. *B65G 1/06* (2013.01); *H05K 13/04* (2013.01); *H05K 13/0408* (2013.01); *H05K 13/0409* (2018.08)

(58) Field of Classification Search
CPC .. B65G 1/06; H05K 13/0408; H05K 13/0409; H05K 13/04
See application file for complete search history.

(56) References Cited

U.S. PATENT DOCUMENTS

| | | | |
|---|---|---|---|
| 5,727,311 A | 3/1998 | Ida et al. | |
| 6,524,052 B1 * | 2/2003 | Yamauchi et al. | 414/331.1 |
| 6,735,856 B1 * | 5/2004 | Kitamura et al. | 29/833 |
| 6,971,157 B1 * | 12/2005 | Yoshida et al. | 29/739 |
| 9,055,710 B2 * | 6/2015 | Morishima | H05K 13/0434 |
| 2002/0131850 A1 * | 9/2002 | Yang | 414/281 |
| 2006/0111222 A1 * | 5/2006 | Yasui | 483/1 |

FOREIGN PATENT DOCUMENTS

| | | |
|---|---|---|
| EP | 2 916 638 A1 | 9/2015 |
| JP | 5-104350 A | 4/1993 |
| JP | 10-261893 A | 9/1998 |
| JP | 2013-239533 A | 11/2013 |
| WO | 2014/068673 A1 | 5/2014 |
| WO | WO 2014/069016 A1 | 5/2014 |

OTHER PUBLICATIONS

International Search Report dated Oct. 7, 2014 in PCT/JP2014/069819 filed Jul. 28, 2014.

* cited by examiner

*Primary Examiner* — Glenn F Myers
(74) *Attorney, Agent, or Firm* — Oblon, McClelland, Maier & Neustadt, L.L.P.

(57) ABSTRACT

In a palette accommodation device in which a nozzle palette to which a suction nozzle can be installed is stored, a plurality of storage sections (parts on one pair of comb teeth which are positioned at the same height) for storing the nozzle palette, are installed to be aligned in the vertical direction. In addition, a support arm moves in the vertical direction, and moves in the direction of approaching the storage section and in the direction of being separated from the storage section.

5 Claims, 10 Drawing Sheets

NOZZLE STORAGE

TECHNICAL FIELD

The present application relates to a nozzle storage for storing a nozzle palette which can place a suction nozzle thereon.

BACKGROUND ART

In an electronic component mounting machine which mounts an electronic component on a circuit board, since a suction nozzle which corresponds to a shape or a size of the electronic component is used, many suction nozzles are necessary. Therefore, a nozzle storage for storing a nozzle palette which can place the suction nozzle thereon, exists. Specifically, for example, in the nozzle storage described in the following Patent Literature, a plurality of storage sections for storing the nozzle palette circulates in the nozzle storage. In addition, the nozzle palette is stored to the storage section which has circulated at a predetermined position, and the nozzle palette is taken out from the storage section which has circulated at a predetermined position.

PTL 1: International Publication No. 2014/068673

SUMMARY

According to the nozzle storage described in the above-described Patent Literature, by storing the plurality of nozzle palettes, it is possible to store many suction nozzles. However, in the nozzle storage described in the above-described Patent Literature, there is a concern that the structure becomes complicated due to a mechanism or the like for making the storage section circulate. The present disclosure considers such a situation, and an object of the present disclosure is to simplify a structure of a nozzle storage.

In order to solve the above-described problem, in a nozzle storage described in the specification, which has a plurality of storage sections for storing a nozzle palette which is capable of placing a suction nozzle thereon, the plurality of storage sections are installed to be aligned in the vertical direction, and the nozzle storage includes an arm for storing the nozzle palette to the plurality of storage sections, and for taking out the nozzle palette from the plurality of storage sections, a first moving mechanism which moves the arm in the direction in which the plurality of storage sections are aligned in a state of opposing the plurality of storage sections, and a second moving mechanism which moves the arm in the direction of approaching the plurality of storage sections, and in the direction of being separated from the plurality of storage sections.

In the nozzle storage described in the specification, the plurality of storage sections are installed to be aligned in the vertical direction. In addition, the arm moves in the direction in which the plurality of storage sections are aligned, and moves in the direction of approaching the plurality of storage sections, and in the direction of being separated from the plurality of storage sections. In other words, as the arm moves in two directions, it is possible to take out the nozzle palette from the storage section, and to store the nozzle palette to the storage section. Accordingly, it is possible to simplify a mechanism for moving the arm, and to achieve simplification of the structure of the nozzle storage.

DESCRIPTION OF EMBODIMENTS

Hereinafter, as an aspect for carrying out the present disclosure, an embodiment of the present disclosure will be described in detail with reference to the drawings.

Configuration of Electronic Component Mounting Device

Figure 1:
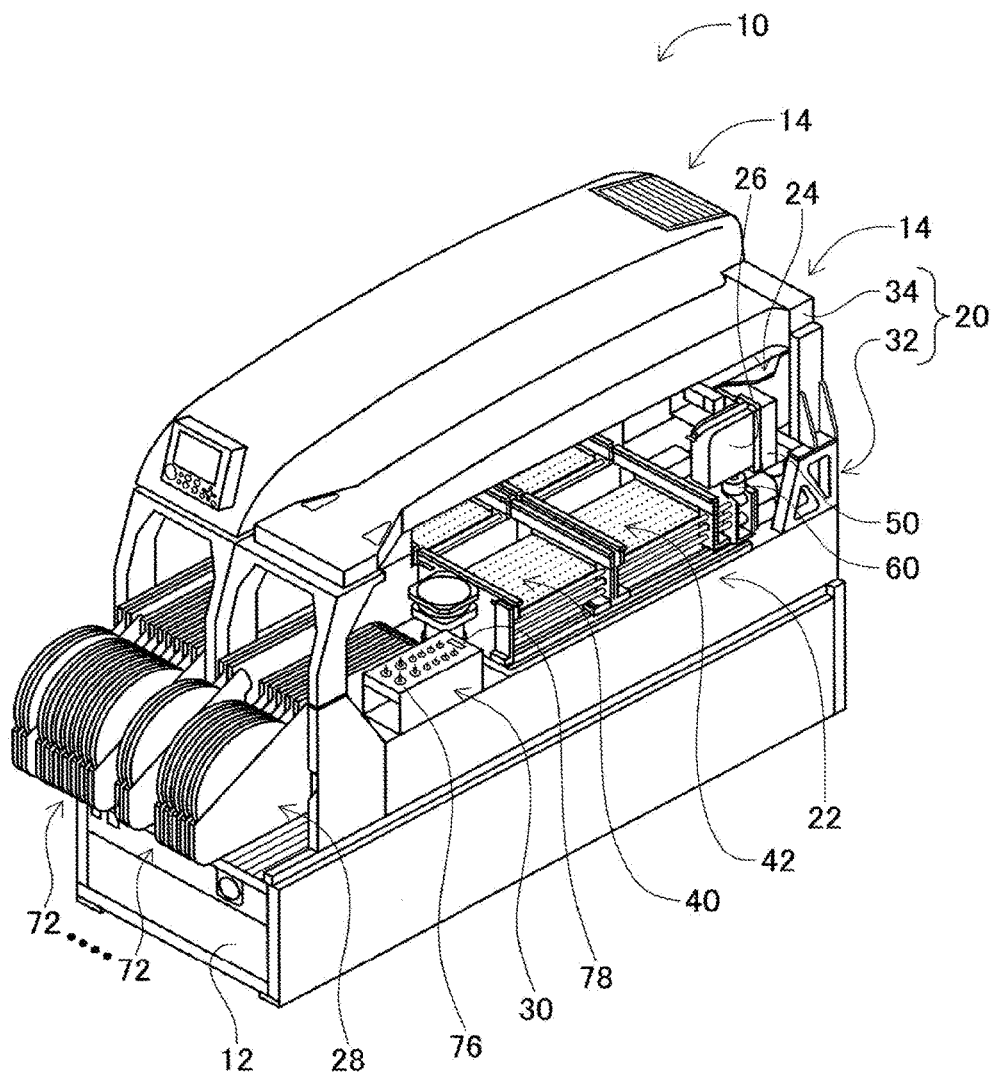
FIG. 1 is a perspective view illustrating an electronic component mounting device.

In FIG. 1, an electronic component mounting device (hereinafter, there is a case of being shortened as "mounting device") 10 is illustrated. The mounting device 10 includes one system base 12, and two electronic component mounting machines (hereinafter, there is a case of being shortened as "mounting machine") 14 which are adjacent to each other on the system base 12. In addition, the direction in which the mounting machines 14 are aligned is referred to as the X-axis direction, and the horizontal direction which is perpendicular to the direction is referred to as the Y-axis direction.

Each mounting machine 14 mainly includes a mounting machine main body 20, a conveyance device 22, a mounting head moving device (hereinafter, there is a case of being shortened as "moving device") 24, a mounting head 26, a supply device 28, and a nozzle station 30. The mounting machine main body 20 is configured of a frame section 32, and a beam section 34 which is constructed on the frame section 32.

The conveyance device 22 is provided with two conveyor devices 40 and 42. The two conveyor devices 40 and 42 are installed in the frame section 32 to extend to be parallel to each other and in the X-axis direction. Each of the two conveyor devices 40 and 42 conveys the circuit board supported by each of the conveyor devices 40 and 42 in the X-axis direction by an electromagnetic motor (not illustrated). In addition, the circuit board is held to be fixed by a board holding device (not illustrated) at a predetermined position.

The moving device 24 is an XY robot type moving device. The moving device 24 is provided with an electromagnetic motor (not illustrated) which slides a slider 50 in the X-axis direction, and an electromagnetic motor (not illustrated) which slides in the Y-axis direction. The mounting head 26 is attached to the slider 50, and the mounting head 26 is moved to an arbitrary position on the frame section 32 by an operation of the two electromagnetic motors.

Figure 2:
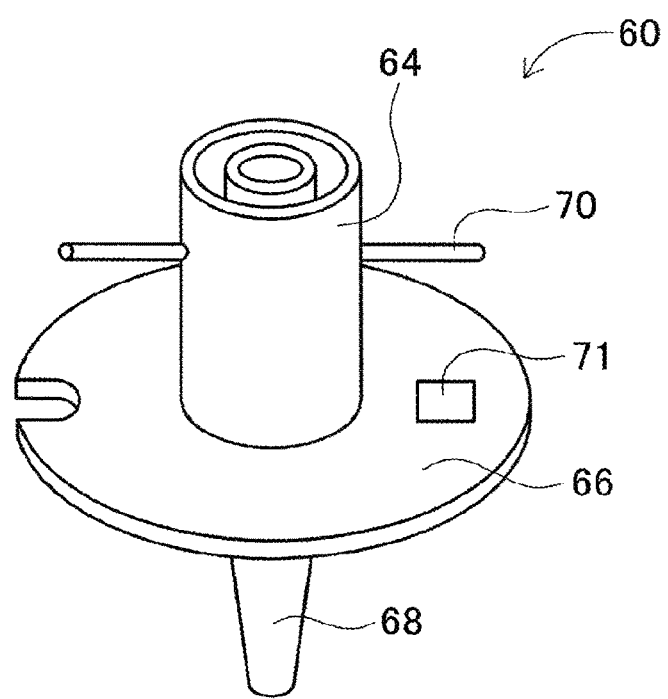
FIG. 2 is a perspective view illustrating a suction nozzle.

The mounting head 26 mounts an electronic component onto the circuit board. On a lower end surface of the mounting head 26, a suction nozzle 60 is provided. As illustrated in FIG. 2, the suction nozzle 60 is configured of a body cylinder 64, a flange section 66, a suction pipe 68, and a locking pin 70. The body cylinder 64 is made in a cylindrical shape, and the flange section 66 is fixed to be overhung on an outer circumferential surface of the body cylinder 64. On an upper surface of the flange section 66, a 2D code 71 is recorded. The 2D code 71 is an identification mark for identifying unique information of the suction nozzle 60.

In addition, the suction pipe 68 is made in a shape of a narrow pipe, and is held to be movable in the axial line direction by the body cylinder 64 in a state of extending downward from a lower end portion of the body cylinder 64. Between the suction pipe 68 and the body cylinder 64, a spring (not illustrated) is installed in a compressed state, and the suction pipe 68 is biased in the direction of extending downward from the lower end portion of the body cylinder 64 by an elastic force of the spring. In other words, by applying a force which is against the elastic force of the spring to a tip end of the suction pipe 68, the suction pipe 68 retreats toward the inside of the body cylinder 64.

In addition, the locking pin 70 is provided in an upper end portion of the body cylinder 64 to extend in the radial direction of the body cylinder 64. The suction nozzle 60 is attached to be attachable to and detachable from the mounting head 26 by a one-touch operation by using the locking pin 70. In addition, the suction nozzle 60 passes through a positive and negative pressure supply device (not illustrated) via a negative pressure air passage and a positive pressure air passage. Each of the suction nozzles 60 sucks and holds the electronic component by the negative pressure, and detaches the held electronic component by the positive pressure. In addition, the mounting head 26 has a nozzle lifting and lowering device (not illustrated) which lifts and lowers the suction nozzle 60. By the nozzle lifting and lowering device, the mounting head 26 changes the position in the vertical direction of the held electronic component.

The supply device 28 is a feeder type supply device, and as illustrated in FIG. 1, the supply device 28 is installed in an end portion on a front side of the frame section 32. The supply device 28 has a tape feeder 72. The tape feeder 72 is accommodated in a state where a taped component is wound therearound. The taped component is a component in which the electronic component is taped. In addition, the tape feeder 72 sends out the taped component by a feed device (not illustrated). Accordingly, the feeder type supply device 28 supplies the electronic component at a supply position by sending out the taped component.

The nozzle station 30 has a nozzle tray 76 which accommodates the plurality of suction nozzles 60 therein. In the nozzle station 30, replacement of the suction nozzle 60 attached to the mounting head 26, and the suction nozzle 60 accommodated in the nozzle tray 76, is performed as necessary. In addition, the nozzle tray 76 is attachable to and detachable from the nozzle station 30, can perform collection of the suction nozzle 60 accommodated in the nozzle tray 76, and replenishment of the suction nozzle 60 to the nozzle tray 76, on the outside of the mounting machine 14. In addition, on the upper surface of the nozzle tray 76, a 2D code 78 is recorded.

Mounting Work by Mounting Machine

In the mounting machine 14, by the above-described configuration, with respect to the circuit board held by the conveyance device 22, it is possible to perform mounting work by the mounting head 26. Specifically, by a command of a control device (not illustrated) of the mounting machine 14, the circuit board is conveyed to a working position, and at this position, the circuit board is held to be fixed by the board holding device. In addition, by the command of the control device, the tape feeder 72 sends out the taped component, and supplies the electronic component at the supply position. In addition, the mounting head 26 moves to an upper part of the supply position of the electronic component, and suctions and holds the electronic component by the suction nozzle 60. Next, the mounting head 26 moves to the upper part of the circuit board, and mounts the held electronic component on the circuit board.

Replacement of Suction Nozzle in Nozzle Station

In the mounting machine 14, as described above, the electronic component supplied by the tape feeder 72 is suctioned and held by the suction nozzle 60, and the electronic component is mounted on the circuit board. In the mounting machine 14 configured in this manner, in accordance with the size or the type of the electronic component, the suction nozzle 60 is changed. In other words, for example, when suctioning and holding a large electronic component, the suction nozzle 60 having a large diameter is used, and when suctioning and holding a small electronic component, the suction nozzle 60 having a small diameter is used. Therefore, in accordance with the type of the manufactured circuit board, it is necessary to use various types of suction nozzles 60, and in the nozzle station 30, in accordance with the type of the manufactured circuit board, various types of suction nozzles 60 are accommodated. In addition, replacement of the suction nozzle 60 attached to the mounting head 26, and the suction nozzle 60 accommodated in the nozzle station 30, is performed as necessary. In addition, since replacement of the suction nozzle 60 attached to the mounting head 26, and the suction nozzle 60 accommodated in the nozzle station 30, is a known method, the description thereof will be omitted.

As illustrated above, in the nozzle station 30, in accordance with the type of the manufactured circuit board, various types of suction nozzles 60 are accommodated. Therefore, for example, in a case where the type of the circuit board of a manufacturing target is changed, the nozzle tray 76 is detached from the nozzle station 30, and by using a nozzle management device, the suction nozzle 60 which is accommodated in the nozzle tray 76 is replaced. Hereinafter, the nozzle management device will be described in detail.

Configuration of Nozzle Management Device

Figure 3:
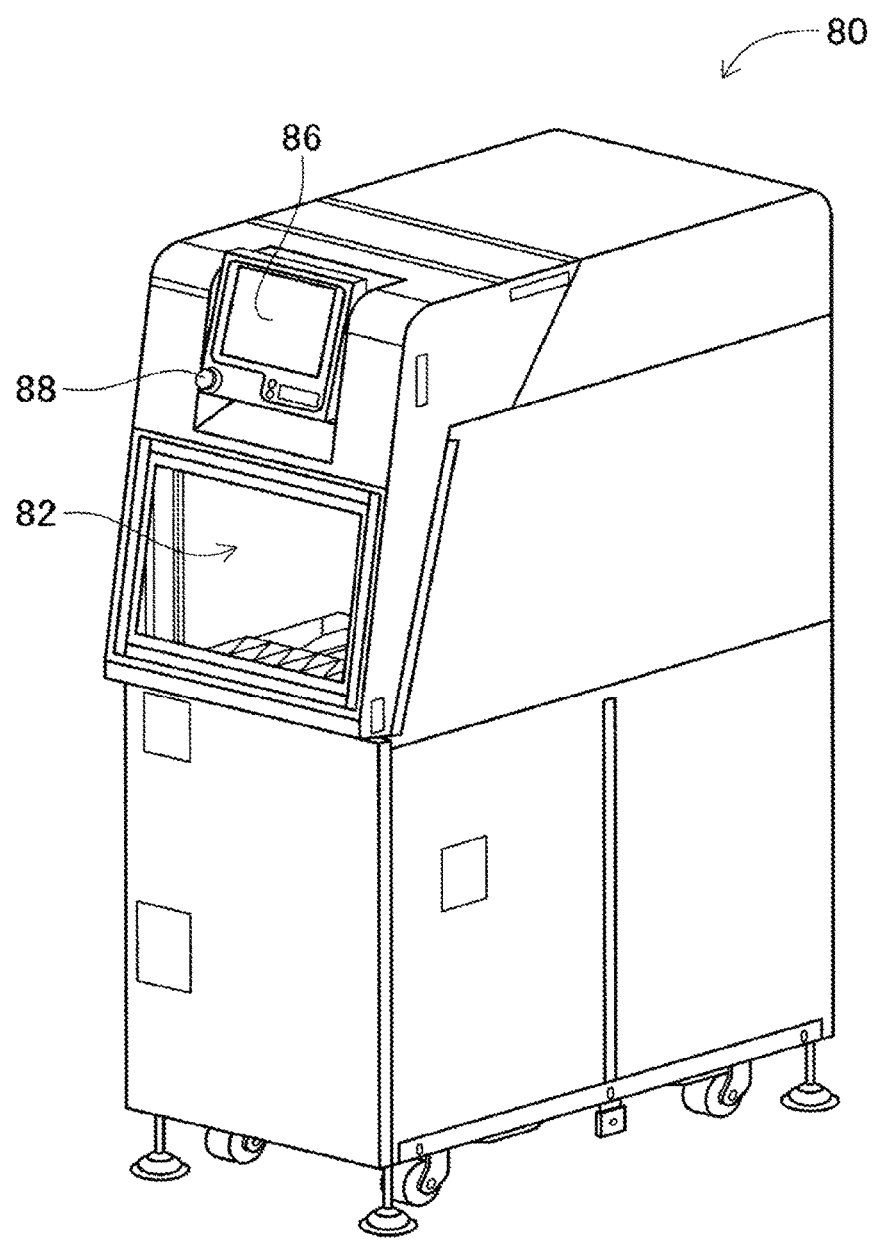
FIG. 3 is a perspective view illustrating a nozzle management device.

As illustrated in FIG. 3, a nozzle management device 80 has a substantially rectangular parallelepiped shape, and on a front surface, a door 82 for accommodating the nozzle tray 76 in the nozzle management device 80, or for taking out the nozzle tray 76 from the nozzle management device 80, is provided. Above the door 82, a panel 86 which displays various pieces of information, and an operation switch 88 for inputting the information or the like, are installed.

Figure 4:
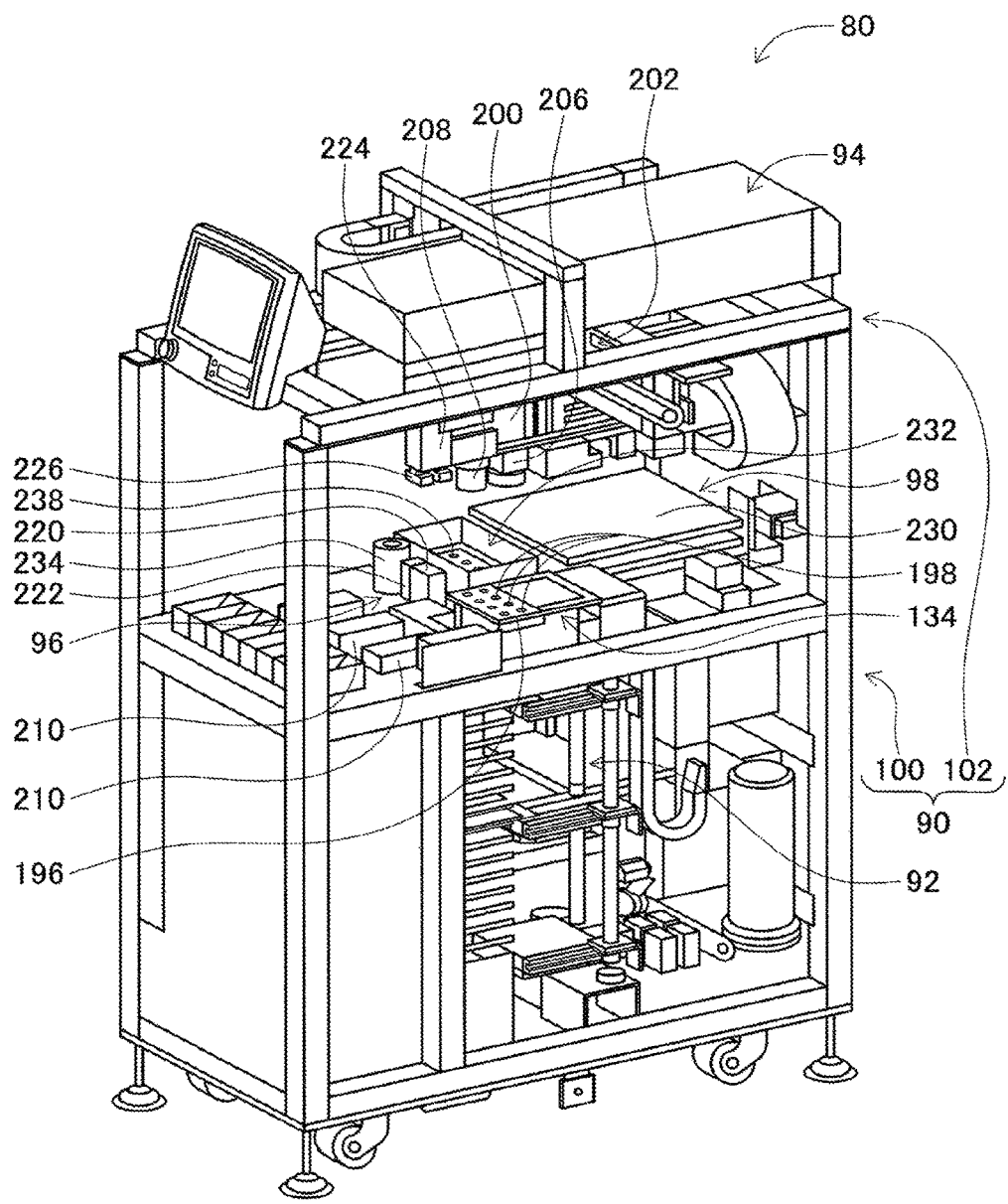
FIG. 4 is a perspective view illustrating an inner structure of the nozzle management device.

As illustrated in FIG. 4, the nozzle management device 80 includes a management device main body 90, a palette accommodation device 92, a nozzle transfer device 94, a nozzle inspection device 96, and a nozzle cleaning device 98. In addition, FIG. 4 is a perspective view illustrating a state where an outer shell member of the nozzle management device 80 is detached, and illustrates an inner structure of the nozzle management device 80.

(a) Management Device Main Body

The management device main body 90 is configured of a frame section 100, and a beam section 102 constructed in the frame section 100. The frame section 100 is a hollow structure, and in a state where an upper end portion of the palette accommodation device 92 is exposed on an upper surface of the frame section 100, the palette accommodation device 92 is installed on the inside of the frame section 100.

(b) Palette Accommodation Device

Figure 5:
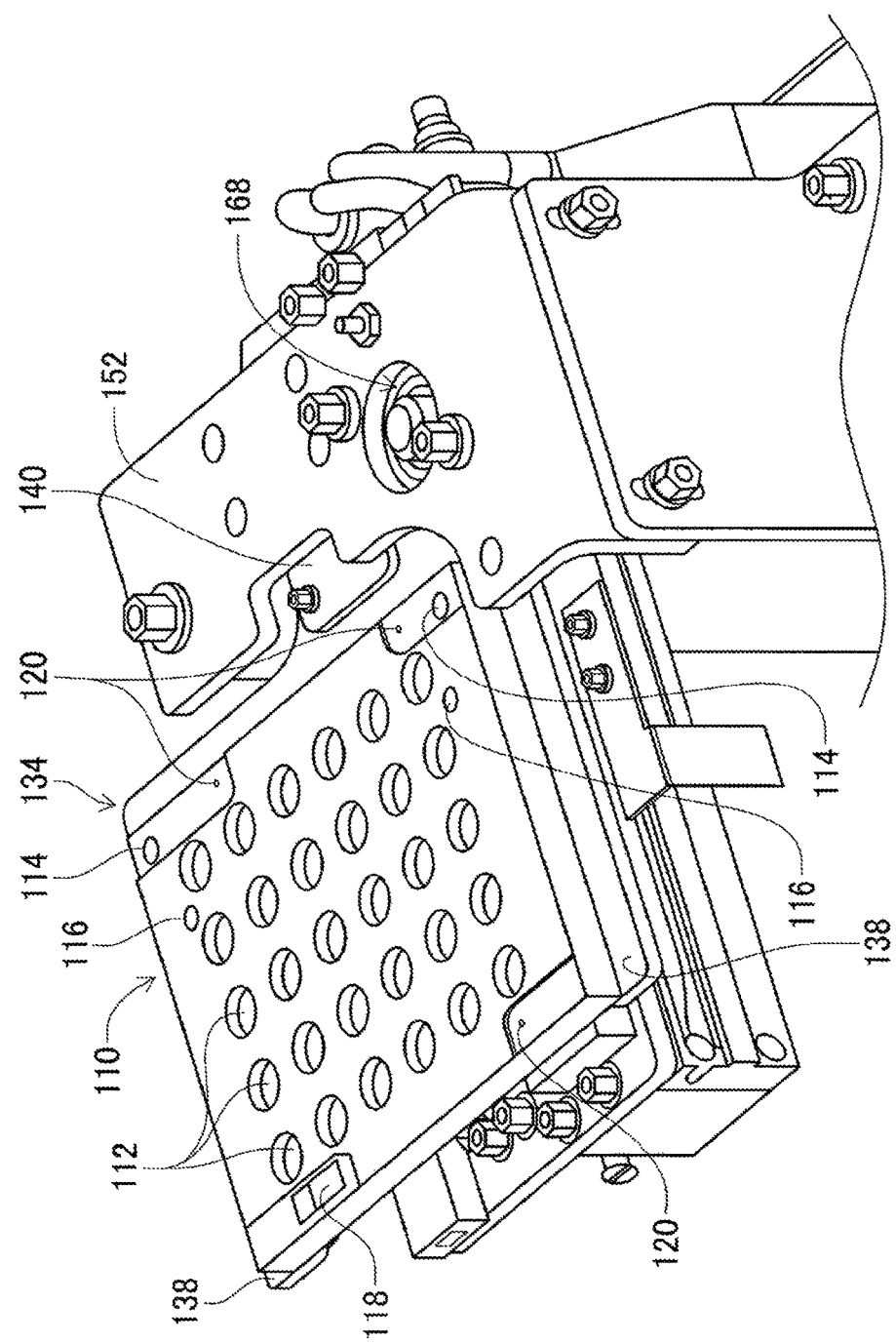
FIG. 5 is a perspective view illustrating a palette moving device on which a nozzle palette is placed.

The palette accommodation device 92 is a device which accommodates a nozzle palette 110 illustrated in FIG. 5 therein. In the nozzle palette 110, a plurality of placing holes 112 are formed. The placing hole 112 penetrates the nozzle palette 110 in the vertical direction, and an inner diameter thereof is greater than an outer diameter of the suction pipe 68 of the suction nozzle 60, and is smaller than an outer diameter of the flange section 66. Therefore, the suction nozzle 60 is placed in a state of being inserted into the suction pipe 68 in the placing hole 112.

In the nozzle palette 110, in two adjacent angle portions, two arm engagement holes 114 are formed, and in the vicinity of the two arm engagement holes 114, two bracket engagement holes 116 are formed. In addition, in the nozzle palette 110, in additional angle portions, a 2D code 118 is recorded. Furthermore, in the nozzle palette 110, in three angle portions other than the angle portion in which the 2D code 118 is recorded, three fiducial marks 120 are recorded.

Figure 6:
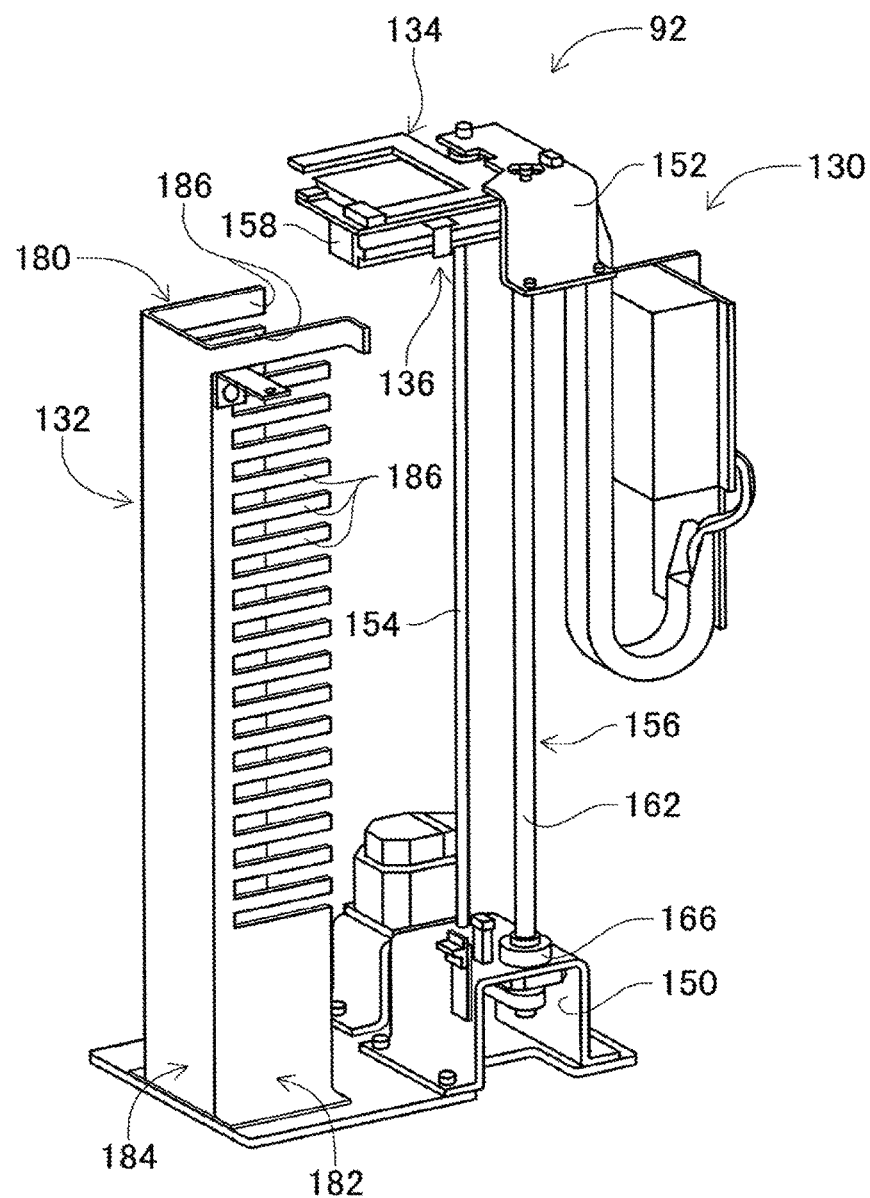
FIG. 6 is a perspective view illustrating a palette accommodation device.

The palette accommodation device 92 is a device which accommodates the nozzle palette 110 having the above-described structure therein. As illustrated in FIG. 6, the palette accommodation device 92 has a palette moving device 130 and a palette accommodation tower 132, and the palette moving device 130 and the palette accommodation tower 132 are installed to oppose each other.

Figure 7:
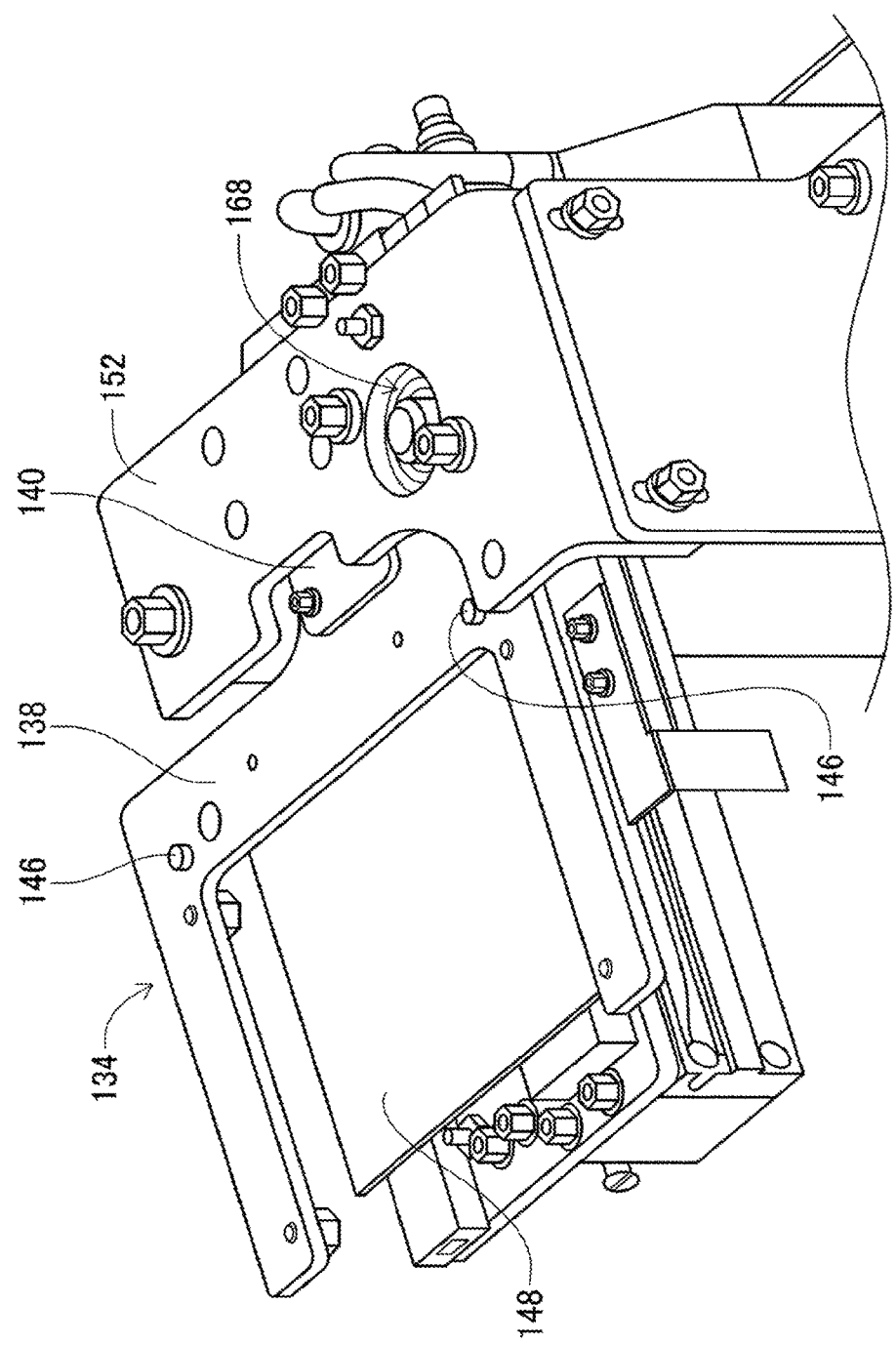
FIG. 7 is a perspective view illustrating a support arm.

The palette moving device 130 is configured of a support arm 134 and an arm moving mechanism 136. As illustrated in FIG. 7, the support arm 134 is configured of an arm section 138 and a base end section 140. The arm section 138 is made in a substantially square-bracket shape, and the end portion on an opening side functions as a distal end section. In other words, the distal end section of the arm section 138 extends out into a fork. The base end section 140 is positioned in the end portion on a side opposite to the distal end section of the arm section 138. On the base end section 140 side of the arm section 138, two engaging pins 146 are formed. The two engaging pins 146 are formed at positions which correspond to the two arm engagement holes 114 of the nozzle palette 110, and an outer diameter of the engaging pin 146 is smaller than an inner diameter of the arm engagement hole 114. In addition, a dimension of an opening portion of the square-bracket shaped arm section 138, that is, an interval of the distal end sections which extend out in a fork of the arm section 138, is smaller than a width of the nozzle palette 110. Therefore, as illustrated in FIG. 5, on an upper surface of the arm section 138, the nozzle palette 110 is placed, and in this state, two engaging pins 146 of the arm section 138 is engaged with the two arm engagement holes 114 of the nozzle palette 110. Accordingly, the nozzle palette 110 is appropriately supported by the support arm 134 without generating a positional deviation. In addition, as illustrated in FIG. 7, a reflection plate 148 is attached to a lower surface side of the arm section 138.

As illustrated in FIG. 6, the arm moving mechanism 136 has a base 150, an upper cover 152, a guide rail 154, a screw mechanism 156, a first slider 158, and a second slider (refer to FIG. 8) 160. The guide rail 154 is installed to extend in the vertical direction, and is fixed to the base 150 in the lower end portion. In addition, the upper cover 152 is fixed to the upper end portion of the guide rail 154.

The screw mechanism 156 is configured of a screw rod 162 and a nut 164. On an outer circumferential surface of the screw rod 162, a male screw (not illustrated) is formed, and the screw rod 162 is installed to be parallel to the guide rail 154 to extend in the vertical direction. The lower end portion of the screw rod 162 is held by the base 150 via a bearing 166, and an upper end portion of the screw rod 162 is held by the upper cover 152 via a bearing (refer to FIG. 5) 168. Accordingly, the screw rod 162 is held by the base 150 and the upper cover 152 to be rotatable around a center shaft thereof. In addition, the screw rod 162 rotates around the center shaft to be controllable by the driving of the electromagnetic motor (not illustrated).

Figure 8:
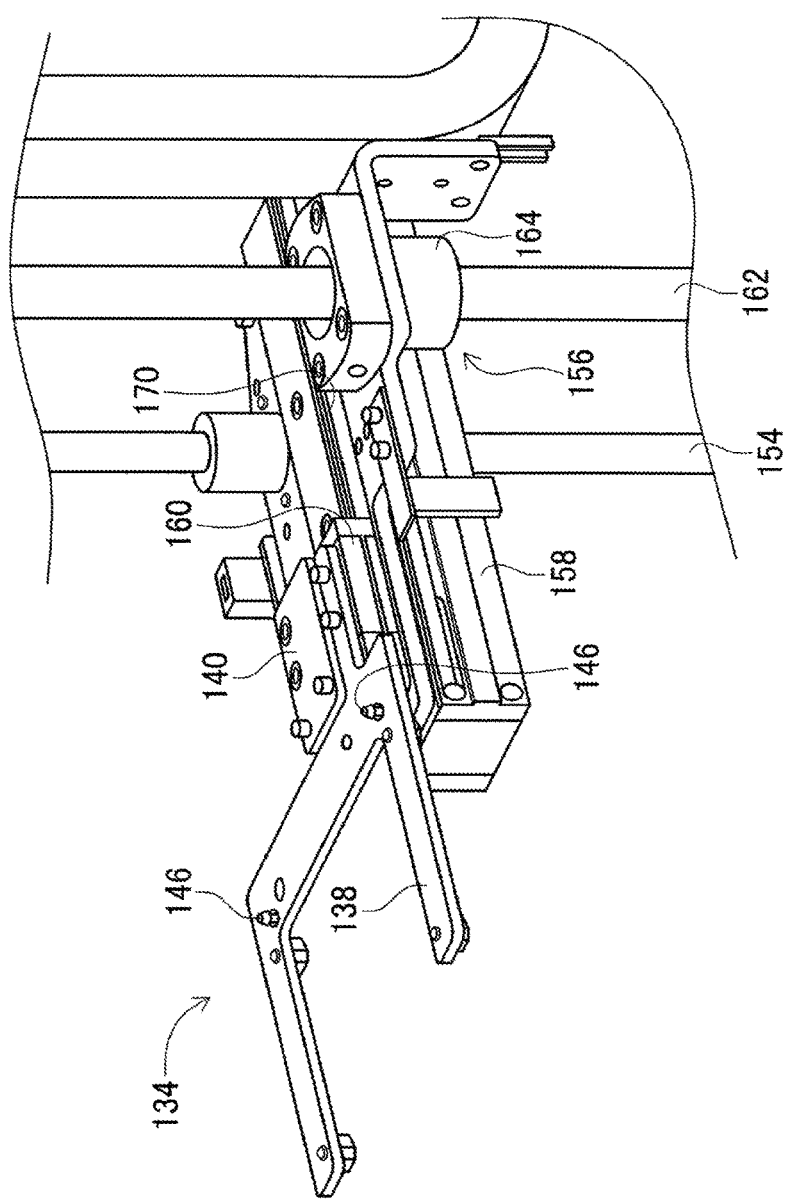
FIG. 8 is a perspective view illustrating a support arm in an extending state.

Meanwhile, as illustrated in FIG. 8, the nut 164 is screwed to the male screw formed on the outer circumferential surface of the screw rod 162. In addition, the nut 164 is fixed to the first slider 158. In the first slider 158, a through-hole (not illustrated) which penetrates in the vertical direction is formed. In addition, the guide rail 154 penetrates the through-hole, and the first slider 158 moves along the guide rail 154. By the structure, as the screw rod 162 rotates by the driving of the electromagnetic motor, the first slider 158 moves to an arbitrary position in the vertical direction along the guide rail 154.

In addition, on the upper surface of the first slider 158, a slide groove 170 is formed to extend out toward the palette accommodation tower 132. Meanwhile, on a rear surface of the second slider 160, a projection portion (not illustrated) is formed, and the projection portion is engaged with the slide groove 170 to be slidable. Accordingly, the second slider 160 moves along the slide groove 170 on the upper surface of the first slider 158. In addition, the second slider 160 moves to an arbitrary position along the slide groove 170 by the driving of the electromagnetic motor (not illustrated).

In addition, the support arm 134 is fixed to the second slider 160 in the base end section 140 in a state where the distal end section of the arm section 138 is toward the palette accommodation tower 132. According to such a structure, the support arm 134 moves in the vertical direction as the screw rod 162 rotates, and approaches and is separated from the palette accommodation tower 132 as the second slider 160 slides along the slide groove 170.

In addition, as illustrated in FIG. 6, the palette accommodation tower 132 makes a quadrangle prismatic shape of which one side wall is cut out, and the cut-out location faces the palette moving device 130. In other words, the palette accommodation tower 132 is configured of three wall surfaces 180, 182, and 184, and one pair of wall surfaces 180 and 182 among the three wall surfaces 180, 182, and 184, face each other at a predetermined interval. In addition, side edges of the one pair of wall surfaces 180 and 182 are linked to each other by the remaining wall surface 184. In addition, a side edge by which the wall surface 184 of one pair of wall surfaces 180 and 182 is not linked, faces the palette moving device 130.

One pair of wall surfaces 180 and 182 of the palette accommodation tower 132 is made in a shape of a comb teeth excluding a lower end portion side, and the plurality of comb teeth 186 extend out toward the palette moving device 130. In addition, one pair of wall surfaces 180 and 182 have the same shape. Therefore, the plurality of comb teeth 186 of the wall surface 180 and the plurality of comb teeth 186 of a wall surface 182 have the same shape, and the N-th comb teeth 186 from above among the plurality of comb teeth 186 of the wall surface 180, and the N-th comb teeth 186 from above among the plurality of comb teeth 186 of the wall surface 182, that is, the two comb teeth 186 which are adjacent to each other in the leftward-and-rightward direction are positioned at the same height. In addition, the distance between the wall surface 180 and the wall surface 182, that is, the distance between the two comb teeth 186 which are adjacent to each other in the leftward-and-rightward direction, is shorter than the width of the nozzle palette 110. Furthermore, the distance between the two comb teeth 186 which are adjacent to each other in the vertical direction, that is, the distance between the N-the comb teeth 186 from above among the plurality of comb teeth 186 and the N+1-th comb teeth 186, is longer than a thickness of the nozzle palette 110. Therefore, it is possible to place the nozzle palette 110 on the two comb teeth 186 which are adjacent to each other in the leftward-and-rightward direction.

Specifically, for example, as illustrated in FIG. 5, a case where the nozzle palette 110 supported by the support arm 134 is placed on the two comb teeth 186 which are adjacent to each other in the leftward-and-rightward direction of the palette accommodation tower 132, will be described. In addition, the support arm 134 illustrated in FIG. 5 moves to the uppermost part by the operation of the screw mechanism 156, and moves in the direction of being separated from the palette accommodation tower 132 by the sliding of the second slider 160.

Figure 9:
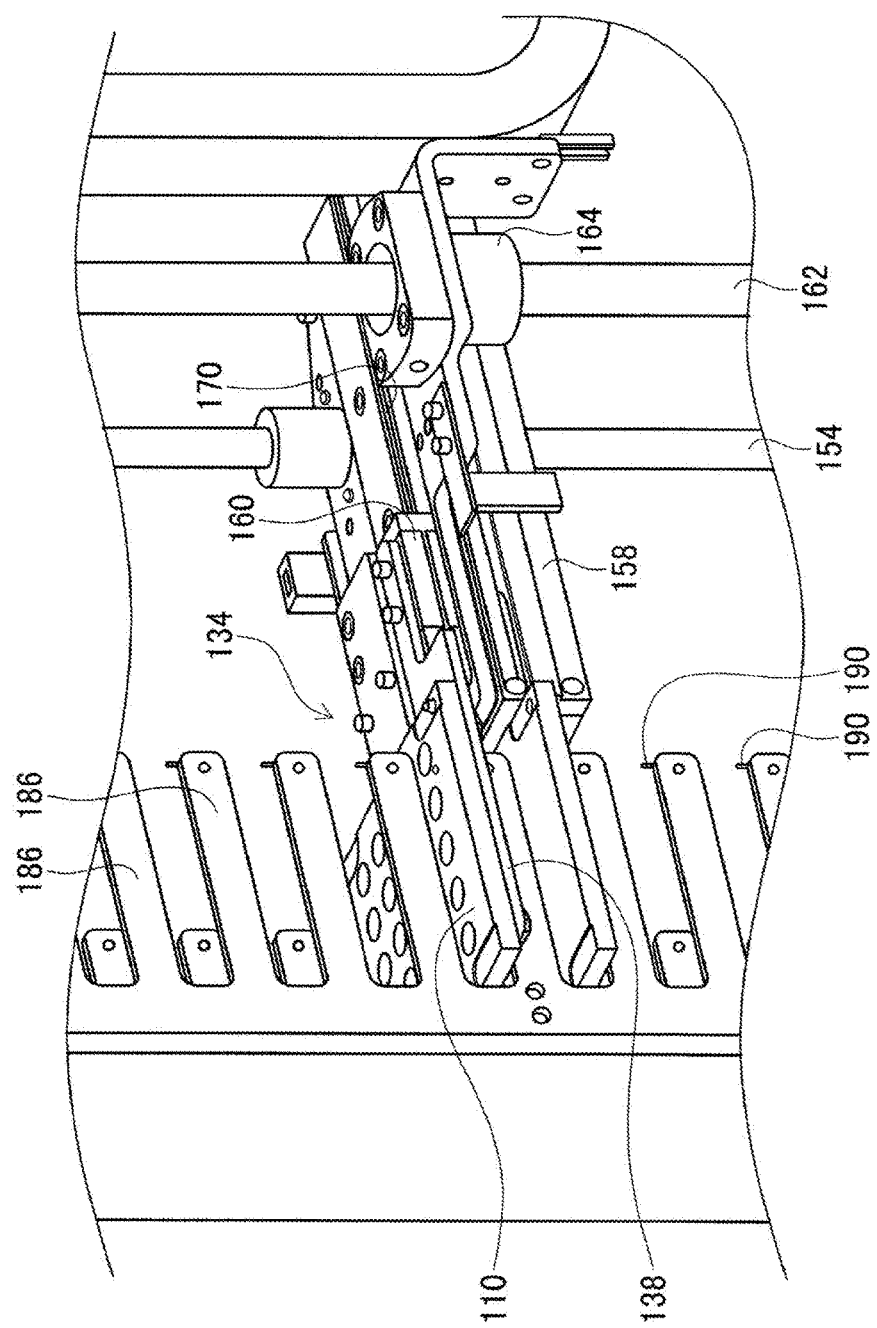
FIG. 9 is a perspective view illustrating the palette moving device when storing the nozzle palette in a palette accommodation tower.

The support arm 134 illustrated in FIG. 5, first, moves downward by the operation of the screw mechanism 156. At this time, the support arm 134 moves downward so that the nozzle palette 110 supported by the support arm 134 is positioned between the two comb teeth 186 which are adjacent to each other in the vertical direction. In addition, the support arm 134 moves in the direction of approaching the palette accommodation tower 132 by the sliding of the second slider 160. Accordingly, as illustrated in FIG. 9, the nozzle palette 110 supported by the support arm 134 is inserted into between the two comb teeth 186 which are adjacent to each other in the vertical direction. In addition, the support arm 134 moves downward by the operation of the screw mechanism 156.

Figure 10:
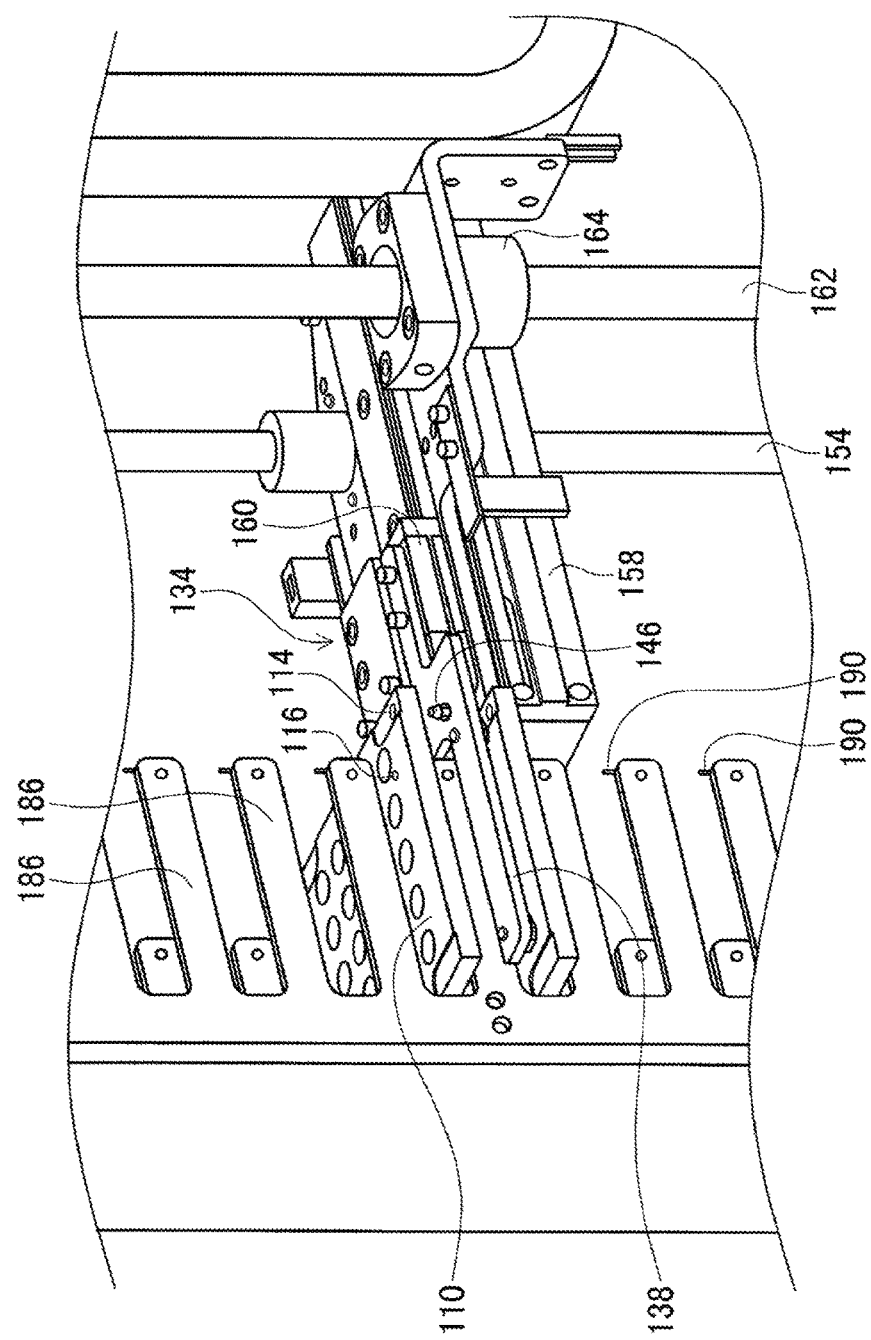
FIG. 10 is a perspective view illustrating the palette moving device when storing the nozzle palette in the palette accommodation tower.

Accordingly, as illustrated in FIG. 10, the nozzle palette 110 supported by the support arm 134 is placed in the two comb teeth 186 which are adjacent to each other in the leftward-and-rightward direction. At this time, the engagement of the engaging pin 146 of the support arm 134 with the arm engagement hole 114 of the nozzle palette 110 is released. When the engagement of the engaging pin 146 with the arm engagement hole 114 is released, the downward movement of the support arm 134 is stopped, and the support arm 134 moves in the direction of being separated from the palette accommodation tower 132 by the slider of the second slider 160. In this manner, as the nozzle palette 110 is placed on the two comb teeth 186 which are adjacent to each other in the leftward-and-rightward direction, the nozzle palette 110 is accommodated in the palette accommodation tower 132.

In addition, on the upper surface side of the distal end section of the comb teeth 186, an engaging pin 190 is formed, and the distance between the engaging pins 190 of the two comb teeth 186 which are adjacent to each other in the leftward-and-rightward direction is the same as the distance between the two bracket engagement holes 116 of the nozzle palette 110. Furthermore, the outer diameter of the engaging pin 190 is smaller than the inner diameter of the bracket engagement hole 116. Therefore, when the nozzle palette 110 is placed on the two comb teeth 186 which are adjacent to each other in the leftward-and-rightward direction, the engaging pins 190 of the comb teeth 186 are engaged with the bracket engagement hole 116 of the nozzle palette 110. Accordingly, the nozzle palette 110 is placed on the two comb teeth 186 which are adjacent to each other in the leftward-and-rightward direction without generating a positional deviation.

In addition, the nozzle palette 110 accommodated in the palette accommodation tower 132 is taken out by the support arm 134. Specifically, the support arm 134 moves to the position at which the two comb teeth 186 of which the nozzle palette 110 that is a taking-out target is placed to oppose each other. In addition, the support arm 134 moves in the direction of approaching the palette accommodation tower 132 by the sliding of the second slider 160. Accordingly, as illustrated in FIG. 10, the arm section 138 of the support arm 134 moves to the side of the two comb teeth 186 on which the nozzle palette 110 that is the taking-out target is placed. In addition, the support arm 134 moves upward by the operation of the screw mechanism 156.

At this time, the engaging pin 146 of the support arm 134 is engaged with the arm engagement hole 114 of the nozzle palette 110. In addition, the engagement of the engaging pin 190 of the comb teeth 186 to the bracket engagement hole 116 of the nozzle palette 110 is released. When the engagement of the engaging pin 190 with the bracket engagement hole 116 is released, the upward movement of the support arm 134 is stopped, and the support arm 134 moves in the direction of being separated from the palette accommodation tower 132 by the slider of the second slider 160. Accordingly, the nozzle palette 110 is taken out from the palette accommodation tower 132.

In addition, as described above, the upper end portion of the palette accommodation device 92 is exposed to the upper surface of the frame section 100. Therefore, in a case where the support arm 134 is lifted the most by the operation of the screw mechanism 156, as illustrated in FIG. 4, the support arm 134 is exposed to the upper surface of the frame section 100. In other words, the nozzle palette 110 supported by the support arm 134 is exposed to the upper surface of the frame section 100. In addition, in the upper end portion of the palette accommodation tower 132, a placing plate 196 is installed, and the placing plate 196 is also exposed to the upper surface of the frame section 100. In the placing plate 196, a plurality of circular placing holes 198 which have the same shape as that of the placing hole 112 of the nozzle palette 110 are formed, and on the placing plate 196, it is possible to place the suction nozzle 60.

(c) Nozzle Transfer Device

The nozzle transfer device 94 is a device for transferring the suction nozzle 60 between the nozzle tray 76 and the nozzle palette 110, and as illustrated in FIG. 4, the nozzle transfer device 94 is installed on the beam section 102. The nozzle transfer device 94 has a transfer head 200 and a head moving device 202. A camera 206 in a state of being oriented downward, and a holding chuck 208 for holding the suction nozzle 60, are attached to a lower end surface of the transfer head 200. In addition, the head moving device 202 is an XYZ type moving device which moves the transfer head 200 in the forward-and-rearward direction, in the leftward-and-rightward direction, and in the vertical direction, on the frame section 100.

In addition, on the upper surface of the frame section 100, a fixing stage 210 for setting the nozzle tray 76 is provided, and between the nozzle tray 76 set in the fixing stage 210 and the nozzle palette 110 supported by the support arm 134, the suction nozzle 60 is transferred.

Specifically, when storage work of the suction nozzle 60 to the nozzle management device 80 is performed, a worker sets the nozzle tray 76 on which the suction nozzle 60 is installed to the fixing stage 210. In addition, in the palette accommodation device 92, the support arm 134, which supports the nozzle palette 110 to which the suction nozzle 60 can be installed, moves to the uppermost part by the operation of the screw mechanism 156. In addition, the transfer head 200 moves to the upper part of the nozzle tray 76 and the upper part of the nozzle palette 110 by the operation of the head moving device 202, and the nozzle tray 76 and an image of each of two 2D codes 78 and 118 of the nozzle palette 110 is captured by the camera 206. Accordingly, unique information, such as an ID number of the nozzle tray 76 and the nozzle palette 110, is obtained.

In addition, when the image of the 2D code 118 of the nozzle palette 110 is captured, the fiducial mark 120 of the nozzle palette 110 is also captured, and based on the captured image data of the fiducial mark 120, calibration of the position of the nozzle palette 110 is performed. Furthermore, an image of the placing hole 112 of the nozzle palette 110 is also captured, and it is determined whether or not the suction nozzle 60 is placed in the placing hole 112. Specifically, below the support arm 134, as described above, the reflection plate 148 is installed. Therefore, in a case where the suction nozzle 60 is not placed in the placing hole 112 of the nozzle palette 110, light emitted from the upper part of the nozzle palette 110 is reflected by the reflection plate 148 via the placing hole 112. Meanwhile, in a case where the suction nozzle 60 is placed in the placing hole 112, the light emitted from the upper part of the nozzle palette 110 is blocked by the suction nozzle 60, and is not reflected by the reflection plate 148. In other words, in a case where the reflected light is included in captured image data of the placing hole 112, it is determined that the suction nozzle 60 is not placed in the placing hole 112, and in a case where the reflected light is not included in the captured image data of the placing hole 112, it is determined that the suction nozzle 60 is placed in the placing hole 112.

Next, the transfer head 200 moves to the upper part of the nozzle tray 76 by the operation of the head moving device 202, and the image of the 2D code 71 of the suction nozzle 60 that is a transfer target is captured by the camera 206. Accordingly, the unique information, such as an ID number of the suction nozzle 60 that is the transfer target is obtained. In addition, the suction nozzle 60 that is the transfer target is held by the holding chuck 208.

When the suction nozzle 60 of the transfer target is held by the holding chuck 208, the transfer head 200 moves to the upper part of the nozzle palette 110 which becomes a transfer destination of the suction nozzle 60 by the operation of the head moving device 202, and the held suction nozzle 60 is placed in the placing hole 112 of the nozzle palette 110. Accordingly, the suction nozzle 60 is transferred to the nozzle palette 110 from the nozzle tray 76. In addition, when the suction nozzle 60 is transferred, the ID number of the nozzle palette 110 of the transfer destination, the ID number of the transferred suction nozzle 60, and the transfer position of the nozzle palette 110 of the transfer destination are stored being associated with each other.

In addition, when the transfer of the suction nozzle 60 to the nozzle palette 110 is completed, the nozzle palette 110 is accommodated in the palette accommodation tower 132 by the operations of the screw mechanism 156 and the second slider 160. Accordingly, the storage work of the suction nozzle 60 to the nozzle management device 80 is finished.

In addition, when the suction nozzle 60 is transferred, in a case where there is no space in the placing hole 112 of the nozzle palette 110 of the transfer destination, or the like, the holding chuck 208 which holds the suction nozzle 60 moves to the upper part of the placing plate 196 by the operation of the head moving device 202, and the suction nozzle 60 is temporarily placed in the circular placing hole 198 of the placing plate 196.

In addition, when the installation work of the suction nozzle 60 stored in the nozzle management device 80 onto the nozzle tray 76 is performed, the worker sets the nozzle tray 76 to which the suction nozzle 60 can be installed to the fixing stage 210. In addition, in the palette accommodation device 92, the support arm 134 which supports the nozzle palette 110 moves to the uppermost part by the operation of the screw mechanism 156. In addition, in the nozzle palette 110 supported by the support arm 134, the suction nozzle 60 which is planned to be install to the nozzle tray 76 is placed. In addition, the suction nozzle 60 placed in the nozzle palette 110 is transferred to the nozzle tray 76 by the nozzle transfer device 94. In addition, the transfer work of the suction nozzle 60 placed in the nozzle palette 110 to the nozzle tray 76 is the same as the transfer work of the suction nozzle 60 placed in the nozzle tray 76 to the nozzle palette 110.

(d) Nozzle Inspection Device

The nozzle inspection device 96 is a device which performs inspection of a state of the distal end section of the suction nozzle 60, that is, the suction pipe 68 (hereinafter, there is a case of being shortened as "distal end section inspection"), inspection of a force necessary for retreating the suction pipe 68 toward the inside of the body cylinder 64 (hereinafter, there is a case of being shortened as "retreating force inspection"), and inspection of a flow rate of air which flows in the suction nozzle 60 (hereinafter, there is a case of being shortened as "air flow rate inspection").

As illustrated in FIG. 4, the nozzle inspection device 96 has a camera device 220, a load cell 222, and an air supply device 224. The camera device 220 is installed on the upper surface of the frame section 100 in a state of being oriented upward, and the distal end section inspection is performed by using the camera device 220. Specifically, the suction nozzle 60 that is an inspection target is held by the holding chuck 208 of the nozzle transfer device 94. In addition, the holding chuck 208 moves to the upper part of the camera device 220 by the operation of the head moving device 202. When the holding chuck 208 moves to the upper part of the camera device 220, an image of the suction nozzle 60 held by the holding chuck 208 is captured by the camera device 220 from below. Accordingly, the captured image data of the suction pipe 68 of the suction nozzle 60 is obtained, and based on the captured image data, a state of the suction pipe 68 is inspected. By the inspection, the presence or the absence of abnormalities, such as bending of the suction pipe 68, chipping of the tip end, or collapse of the tip end, are recognized, and it is determined that the suction nozzle 60 in which the abnormality is generated is a defective nozzle.

In addition, the load cell 222 is installed to be adjacent to the camera device 220, and by using the load cell 222, the retreating force inspection is performed. Specifically, the suction nozzle 60 that is an inspection target is held by the holding chuck 208 of the nozzle transfer device 94. In addition, the holding chuck 208 moves to the upper part of the load cell 222 by the operation of the head moving device 202. Furthermore, the holding chuck 208 moves downward so that the lower end portion of the suction pipe 68 of the suction nozzle 60 held by the holding chuck 208 abuts against the load cell 222. At this time, the holding chuck 208 moves downward so that the suction pipe 68 of the suction nozzle 60 retreats by a set amount toward the inside of the body cylinder 64. The load cell 222 detects a load when the suction pipe 68 retreats by the set amount toward the inside of the body cylinder 64, and it is determined whether or not the detection value is greater than a threshold value. The detection value by the load cell 222 indicates a force necessary for retreating the suction pipe 68 toward the inside of the body cylinder 64, and in a case where the value is greater than the threshold value, as a foreign matter is incorporated into the suction nozzle 60 or the suction nozzle 60 is broken, it is considered that the suction pipe 68 is unlikely to retreat toward the inside of the body cylinder 64. Therefore, the suction nozzle 60 which determines that the detection value obtained by the load cell 222 is greater than a threshold value, is determined as a defective nozzle.

In addition, the air supply device 224 is mounted on the transfer head 200 of the nozzle transfer device 94, and can move to an arbitrary position on the frame section 100. The air supply device 224 has an air joint 226, and by connecting the air joint 226 to the body cylinder 64 of the suction nozzle 60, the air flow rate inspection is performed. Specifically, the air supply device 224 moves to the upper part of the suction nozzle 60 placed in any of the nozzle tray 76, the nozzle palette 110, and the placing plate 196 by the operation of the head moving device 202. In addition, the air supply device 224 moves downward so that the air joint 226 is connected to the body cylinder 64 of the suction nozzle 60 that is the inspection target. When the air joint 226 is connected to the body cylinder 64, the air supply device 224 supplies air to the connected body cylinder 64. In addition, air pressure when the air is supplied is measured, and it is determined whether or not the air pressure is greater than a threshold pressure. When the air is supplied to the normal suction nozzle 60, since the air passes across the inside of the suction nozzle 60, the measured air pressure becomes relatively low. Meanwhile, when the air is supplied to the suction nozzle 60 in which shrinkage or the like is generated, since the air is unlikely to pass across the inside of the suction nozzle 60, the measured air pressure becomes relatively high. Therefore, the suction nozzle 60 of which the measured air pressure is greater than the threshold pressure is recognized as a defective nozzle.

In addition, on an upper surface of the frame section 100, a plurality of discard boxes 228 are installed, and the suction nozzle 60 which is determined as a defective nozzle by the inspection is discarded to the discard box 228. In addition, the suction nozzle 60 which is determined as normal by the inspection is placed in any of the nozzle tray 76, the nozzle palette 110, and the placing plate 196.

(e) Nozzle Cleaning Device

The nozzle cleaning device 98 is a device which performs cleaning and drying of the suction nozzle 60, and is installed to be adjacent to the palette accommodation device 92. The nozzle cleaning device 98 is provided with a cleaning and drying mechanism 230, a cleaning palette moving mechanism 232, and a blow device 234. The cleaning and drying mechanism 230 is a mechanism which performs the cleaning and drying of the suction nozzle 60 on the inside. The cleaning palette moving mechanism 232 is a mechanism which moves a cleaning palette 238 between the exposure position at which the cleaning palette 238 is exposed (a position at which the cleaning palette 238 is illustrated in FIG. 4), and the inside of the cleaning and drying mechanism 230. The blow device 234 is a device which is made in a tubular shape, and ejects the air toward the inside. In the nozzle cleaning device 98 having the above-described structure, the cleaning and drying of the suction nozzle 60 is performed.

Specifically, the suction nozzle 60 that is a cleaning target is held by the holding chuck 208 of the nozzle transfer device 94. In addition, the holding chuck 208 moves to the upper part of the exposure position of the cleaning palette moving mechanism 232 by the operation of the head moving device 202. At this time, the cleaning palette 238 moves to the exposure position by the operation of the cleaning palette moving mechanism 232. In addition, the holding chuck 208 moves downward, and the suction nozzle 60 is installed to the cleaning palette 238. When the installation of the suction nozzle 60 onto the cleaning palette 238 is completed, the cleaning palette 238 moves to the inside of the cleaning and drying mechanism 230 by the operation of the cleaning palette moving mechanism 232. In addition, on the inside of the cleaning and drying mechanism 230, the cleaning and drying of the suction nozzle 60 is performed.

When the cleaning and drying of the suction nozzle 60 is completed by the cleaning and drying mechanism 230, the cleaning palette 238 moves to the exposure position by the operation of the cleaning palette moving mechanism 232. At this time, the suction nozzle 60 is dried to a certain degree, but in the cleaning and drying mechanism 230, since the drying of the suction nozzle 60 is performed in a state of being installed on the cleaning palette 238, there is a concern that moisture adheres to the suction nozzle 60. Therefore, by using the blow device 234, the drying of the suction nozzle 60 is performed.

Specifically, the suction nozzle 60 after the cleaning is held by the holding chuck 208 from the cleaning palette 238. Next, the holding chuck 208 moves to the upper part of the blow device 234 by the operation of the head moving device 202, and the holding chuck 208 moves downward so that the suction nozzle 60 held by the holding chuck 208 is inserted into the inside of the blow device 234. In addition, the blow device 234 ejects the air toward the inside. Accordingly, the moisture which adheres to the suction nozzle 60 is blown off, and the drying of the suction nozzle 60 is completed. In addition, the suction nozzle 60 to which the drying is completed by the blow device 234 is placed in any of the nozzle tray 76, the nozzle palette 110, and the placing plate 196 by the operation of the head moving device 202.

In addition, the suction nozzle 60 is an example of a suction nozzle. The nozzle management device 80 is an example of the nozzle storage. The nozzle transfer device 94 is an example of a transfer device. The nozzle palette 110 is an example of a nozzle palette. The placing hole 112 is an example of a placing hole. The arm engagement hole 114 is an example of a first locking target section. The bracket engagement hole 116 is an example of a second locking target section. The support arm 134 is an example of an arm. The engaging pin 146 is an example of a first locking section. The reflection plate 148 is an example of a reflection member. The screw mechanism 156 is an example of a first moving mechanism. The second slider 160 is an example of a second moving mechanism. The comb teeth 186 are an example of a storage section. The engaging pin 190 is an example of a second locking section. The placing plate 196 is an example of a nozzle placing section. The camera 206 is an example of a light receiving section.

In addition, the present disclosure is not limited to the above-described embodiment, and can be carried out in various aspects in which various changes and improvements are performed based on knowledge of those skilled in the art. Specifically, for example, in the above-described embodiment, as a mechanism for moving the support arm 134 in the vertical direction, the screw mechanism is employed, and as a mechanism for moving the support arm 134 in the forward-and-rearward direction, the slide mechanism is employed, but various mechanisms can be employed.

REFERENCE SIGNS LIST

60: suction nozzle, 80: nozzle management device (nozzle storage), 94: nozzle transfer device (transfer device), 110:

nozzle palette, 112: placing hole, 114: arm engagement hole (first locking target section), 116: bracket engagement hole (second locking target section), 134: support arm (arm), 146: engaging pin (first locking section), 148: reflection plate (reflection member), 156: screw mechanism (first moving mechanism), 160: second slider (second moving mechanism), 186: comb teeth (storage section), 190: engaging pin (second locking section), 196: placing plate (nozzle placing section), 206: camera (light receiving section)

The invention claimed is:

1. A nozzle storage comprising:
   a plurality of storage sections for storing a nozzle palette where a suction nozzle is placed thereon, the plurality of storage sections being installed to be aligned in a vertical direction;
   an arm for storing the nozzle palette to the plurality of storage sections, and for taking out the nozzle palette from the plurality of storage sections;
   a first moving mechanism which moves the arm in a direction in which the plurality of storage sections are aligned in a state of opposing the plurality of storage sections; and
   a second moving mechanism which moves the arm in a direction of approaching the plurality of storage sections, and in a direction of being separated from the plurality of storage sections,
   wherein the nozzle palette has a placing hole which penetrates in the vertical direction, and where the suction nozzle is placed, and
   wherein the nozzle storage includes a reflection member which is installed below the nozzle palette, and a light receiving section which is capable of receiving light reflected by the reflection member via the placing hole.

2. The nozzle storage according to claim 1, further comprising:
   a nozzle placing section which is installed above the plurality of storage sections, and which is capable of placing a suction nozzle; and
   a transfer device which is taken out from the storage section, and transfers the suction nozzle between the nozzle palette in a state of being held by the arm and the nozzle placing section.

3. The nozzle storage according to claim 1,
   wherein the arm has a first locking section which is capable of being locked to a first locking target section formed on the nozzle palette.

4. The nozzle storage according to claim 1,
   wherein each of the plural storage sections has a second locking section which is capable of being locked to a second locking target section formed on the nozzle palette.

5. The nozzle storage according to claim 1,
   wherein the light receiving section receives light reflected by the reflection member via the placing hole when the nozzle palette is in a state of being taken out from the storage section and held by the arm.

* * * * *